United States Patent
Heo et al.

(10) Patent No.: US 6,756,654 B2
(45) Date of Patent: Jun. 29, 2004

(54) STRUCTURE OF TRENCH ISOLATION AND A METHOD OF FORMING THE SAME

(75) Inventors: Jin-Hwa Heo, Inchun-shi (KR); Soo-Jin Hong, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/215,342

(22) Filed: Aug. 9, 2002

(65) Prior Publication Data

US 2003/0030121 A1 Feb. 13, 2003

(30) Foreign Application Priority Data

Aug. 9, 2001 (KR) ................................ 10-2001-0047943

(51) Int. Cl.⁷ .............................................. H01L 21/76
(52) U.S. Cl. ...................................... 257/510; 438/427
(58) Field of Search ................................ 438/424, 427, 438/435; 257/510

(56) References Cited

U.S. PATENT DOCUMENTS

| | | | | | |
|---|---|---|---|---|---|
| 4,222,792 A | * | 9/1980 | Lever et al. | ................. | 148/1.5 |
| 4,671,970 A | * | 6/1987 | Keiser et al. | ................. | 427/93 |
| 5,382,541 A | * | 1/1995 | Bajor et al. | .................... | 437/67 |
| 5,387,539 A | * | 2/1995 | Yang et al. | .................... | 437/67 |
| 5,435,888 A | * | 7/1995 | Kalnitsky et al. | ............. | 216/18 |
| 5,445,989 A | * | 8/1995 | Lur et al. | ..................... | 437/67 |
| 5,492,858 A | * | 2/1996 | Bose et al. | ................. | 438/424 |
| 5,504,033 A | * | 4/1996 | Bajor et al. | .................... | 437/67 |
| 6,030,881 A | * | 2/2000 | Papasouliotis et al. | ....... | 438/424 |
| 6,057,209 A | * | 5/2000 | Gardner et al. | ............. | 438/427 |
| 6,300,219 B1 | * | 10/2001 | Doan et al. | ................. | 438/424 |
| 6,316,331 B1 | * | 11/2001 | Tseng | .......................... | 438/431 |
| 2002/0004282 A1 | * | 1/2002 | Hong | .......................... | 438/424 |

FOREIGN PATENT DOCUMENTS

| KR | 1993-0020634 | 10/1993 |
|---|---|---|
| KR | 1995-0002190 | 10/1993 |

OTHER PUBLICATIONS

Stanley Wolf Silicon Processing for the VSLI Era vol. 2 Lattice Press 1990 p. 232.*

* cited by examiner

Primary Examiner—Chandra Chaudhari
Assistant Examiner—David S Blum
(74) Attorney, Agent, or Firm—Lee & Sterba, P.C.

(57) ABSTRACT

The present invention is directed toward a structure and method by which trench isolation for a wide trench and a narrow trench formed in first and second regions of a substrate may be achieved without formation of a void in an isolation layer, a groove exposing an isolation layer, or an electrical bridge between gates in a subsequent process. A lower isolation layer is formed on the substrate in a first and second trench. The lower isolation layer is patterned to fill a lower region of the first trench, and an upper isolation pattern is formed to fill the second trench and a remainder of the first trench. An aspect ratio of first trench is reduced, thereby preventing the occurrence of a void in the upper isolation layer, or a gap between the upper isolation layer and the substrate.

13 Claims, 13 Drawing Sheets

STRUCTURE OF TRENCH ISOLATION AND A METHOD OF FORMING THE SAME

BACKGROUND OF THE INVENTION

1. Field of the Invention

The present invention relates to a semiconductor device and to a method of fabricating the same. More particularly, the present invention relates to a structure of trench isolation and a method of fabricating the same.

2. Description of the Related Art

As semiconductor devices become more highly integrated, aspect ratios correspondingly increase for device isolation. A problem that occurs in semiconductor devices having high aspect ratios is that a void may be generated in a filling material layer used for filling a trench having a high aspect ratio. To eliminate this problem, a process for filling a trench using a multi-layered structure has been developed. In that process, the aspect ratio of the trench is reduced using a spin on glass (SOG) layer having a superior filling characteristic to fill a lower region of the trench, and then, an upper region of the trench is filled with a high density plasma (HDP) oxide layer or the like.

Figure 1:
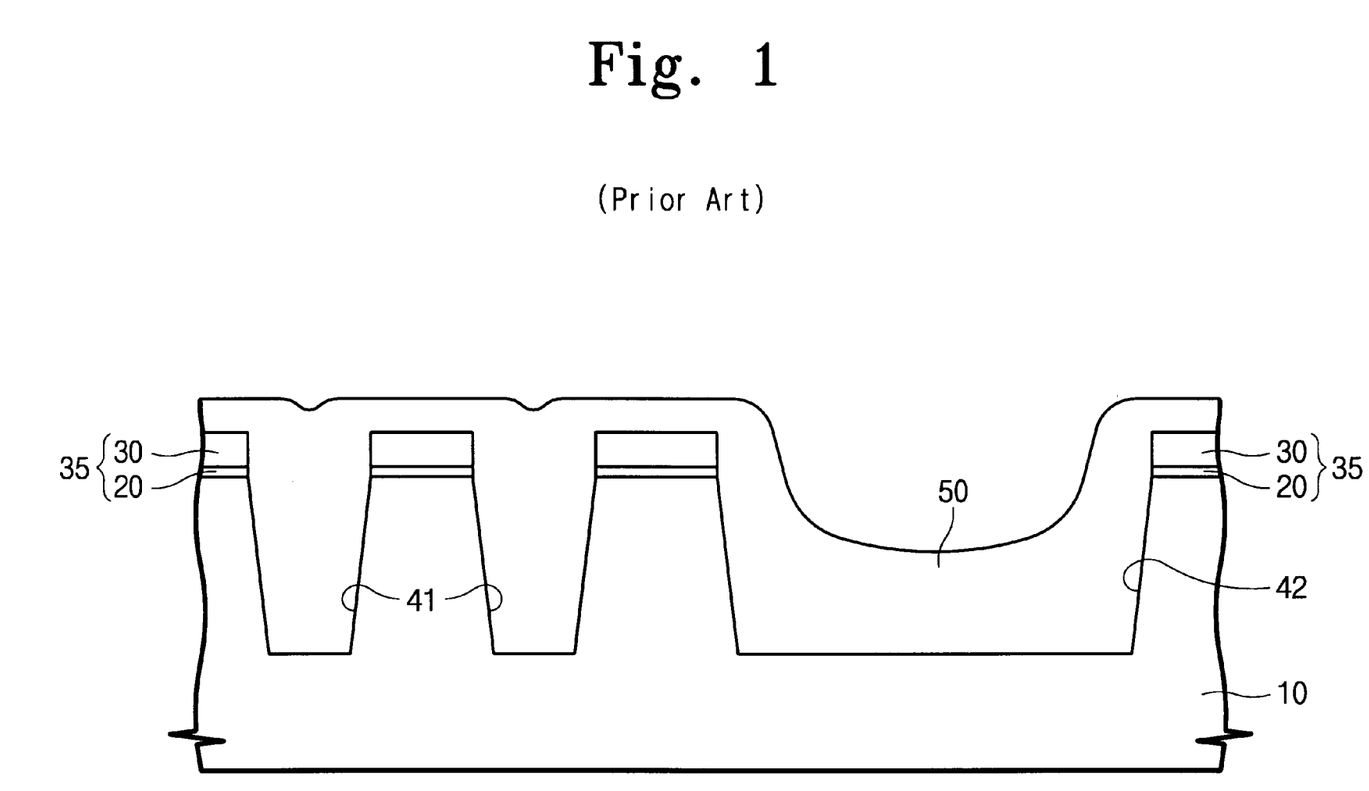
FIGS. 1 through 3 illustrate cross-sectional views for explaining a problem of a conventional method of forming a structure of trench isolation according to the prior art.
Figure 2:
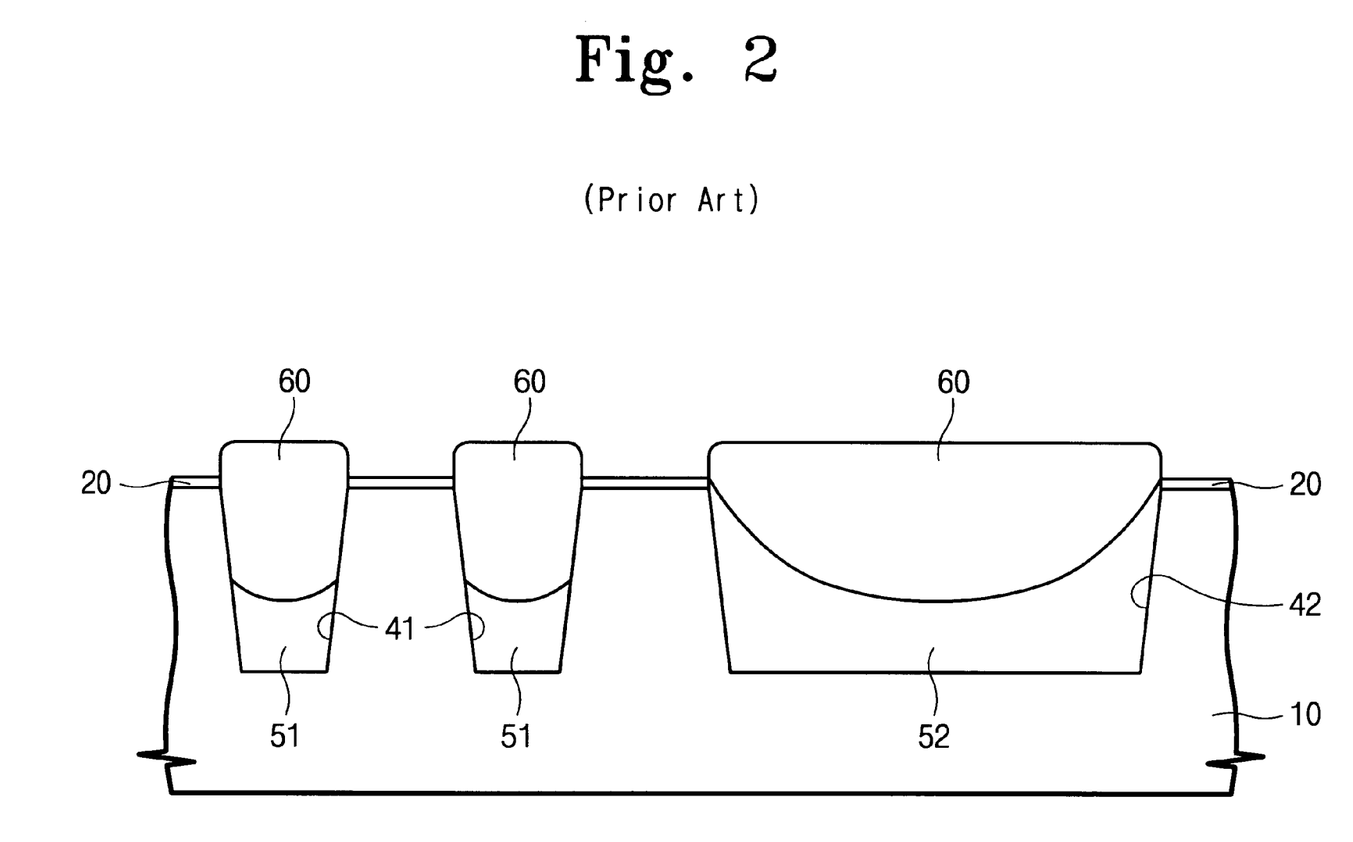
Figure 3:
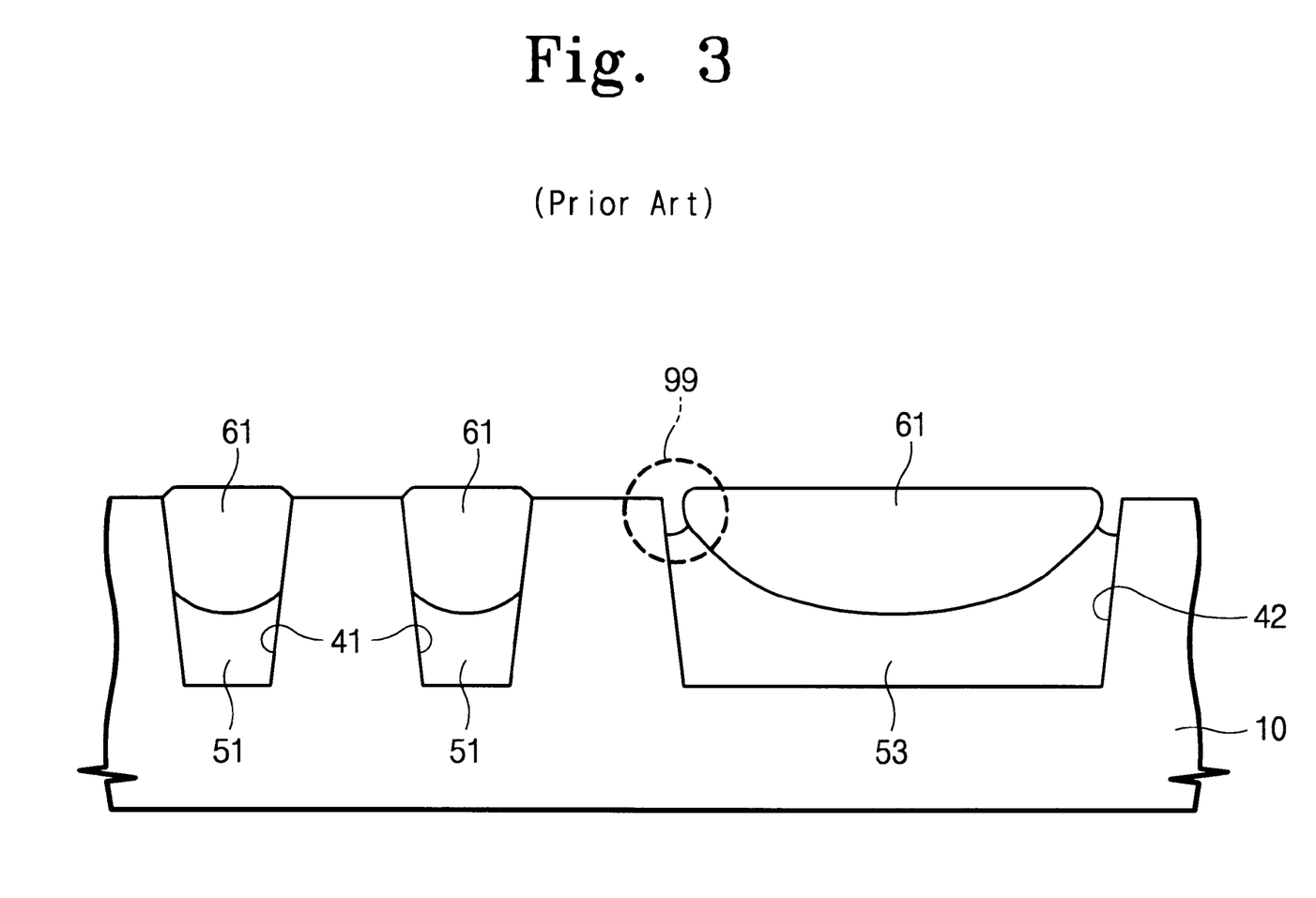

FIGS. 1 through 3 illustrate cross-sectional views for explaining a conventional method of forming a structure of trench isolation using an SOG layer.

Referring to FIG. 1, a trench mask pattern 35 is formed to define an isolation region on a semiconductor substrate 10. A pad oxide pattern 20, a polish stop pattern 30 and a hard mask pattern (not illustrated) are sequentially stacked to form the trench mask pattern 35. The semiconductor substrate 10 is etched using the trench mask pattern 35 as an etch mask to simultaneously form a first trench 41 and a second trench 42. The first trench 41 has an aspect ratio of at least 4 or more, and cannot therefore be filled with a conventionally used isolation layer. The second trench 42, however, has an aspect ratio of 4 or less, and therefore can be filled with an isolation layer using conventional techniques.

Using a spin coating technique, an SOG layer 50 is formed on the entire surface of a semiconductor substrate where the first and second trenches 41 and 42 are formed. More specifically, the SOG layer 50 is coated in a liquid state on the resultant semiconductor substrate, and the semiconductor substrate is rotated. Thus, even a narrow gap region, such as the first trench 41, is filled with the SOG layer 50 to form a planarized top surface. Then, a thermal process is performed to evaporate a solvent contained in the SOG layer 50. After the thermal process, a curing process, which is thermal process, is performed for forming a dense layer by oxidizing silicon atoms contained in the SOG layer 50. Thus, the SOG layer 50 has characteristics of an oxide layer.

However, although the thermal process and the curing process densify the SOG layer 50 in the second trench 42, the SOG layer 50 in the first trench 41 cannot be made uniformly dense because of the high aspect ratio of the first trench 41. Because of this difference in densification, the SOG layer 50 is thinner at a center than at an edge in the trench 42, which has a wide gap region. This phenomenon becomes more pronounced when the SOG layer 50 is thinly formed.

Also, an SOG layer having a low density has a faster etching rate than an SOG layer having a high density. Further still, although the SOG layer 50 undergoes the densification process, in the oxide-etching recipe, the SOG layer 50 has a faster etch rate as compared to that of a conventional oxide layer.

Referring to FIG. 2, the SOG layer 50 is entirely etched to form a first SOG pattern 51 and a second SOG pattern 52, which fill lower regions of the first and second trenches 41 and 42, respectively. But, since the first and second SOG patterns 51 and 52 have faster etching rates than a conventional oxide layer, when forming an isolation pattern with only the patterns 51 and 52, the patterns 51 and 52 are more rapidly etched than the pad oxide pattern 20 in a subsequent process of removing the pad oxide pattern 20. This results in a problem that top surfaces of the first and second SOG patterns 51 and 52 are lower than a top surface of the semiconductor substrate 10. Thus, it is not preferable to form an isolation pattern with only the first and second SOG patterns 51 and 52. It is preferable to form the first and second SOG patterns 51 and 52 to have top surfaces that are lower than that of the semiconductor substrate 10, and then form an upper isolation layer on the resulting structure. The upper isolation layer is preferably formed of an HDP oxide layer or an undoped silicate glass (USG) layer. The upper isolation layer is preferably planarization-etched until the polish stop pattern (30 of FIG. 1) is exposed, to form an upper isolation pattern 60. The exposed polish stop pattern 30 is removed to expose the pad oxide pattern 20.

However, the SOG layer having a low density is more rapidly etched than the SOG layer having a high density. Thus, in the etching process for forming the first and second SOG patterns 51 and 52, an SOG layer 50 filling the second trench 42 is slowly etched in comparison with the SOG layer 50 filling the first trench 41. This results in a top surface of the second SOG pattern 52 being higher than top surfaces of the first SOG pattern 51 and the semiconductor substrate 10.

The first SOG pattern 51 is formed from a material layer for reducing the aspect ratio of the first trench 41. Thus, through the etching process with respect to the SOG layer 50, the first trench 41, in which the SOG pattern 51 is formed, should have a depth such that the first trench 41 may be filled with the upper isolation pattern 60 without a void being formed therein. Therefore, it is not preferable to over-etch the SOG layer 50 in order to make the top surface of the second SOG pattern 52 lower than that of the semiconductor substrate 10.

Referring to FIG. 3, the pad oxide pattern (20 of FIGS. 1 and 2) is removed to expose the top surface of the semiconductor substrate 10. As explained with reference to FIG. 2, the second SOG pattern 52 has a faster etching rate than both the upper isolation pattern 60 and the pad oxide pattern 20, and further has a top surface that is higher than that of the semiconductor substrate 10. Thus, during the etching process for removing the pad oxide pattern 20, the second SOG pattern 52 is etched more rapidly than the upper isolation pattern 60. Consequently, a groove 99 in the resulting second SOG pattern 53 is formed between the resultant upper isolation pattern 61 and the semiconductor substrate 10. The groove 99, in which the second SOG pattern 52 has been etched, results in a bridge of a gate pattern in a subsequent process.

SUMMARY OF THE INVENTION

It is a feature of an embodiment of the present invention to provide a method of forming a structure of trench isolation, in which a trench having a narrow gap is filled with a multi-layered structure including an SOG layer.

It is another feature of an embodiment of the present invention to provide a structure of trench isolation having a multi-layered structure.

A feature of an embodiment of the present invention is directed to a method of forming a structure of trench isolation in which an SOG layer is removed in a wide trench that may be filled by a conventional method. In this method of the present invention, a first trench and a second trench are formed in a first region and a second region of a semiconductor substrate, respectively. Preferably, the first and second regions of the semiconductor substrate are a cell array region and a peripheral circuit region, respectively. A lower isolation pattern is formed to fill a lower region of the first trench, and then, an upper isolation pattern is formed to fill the second trench, and an upper region of the first trench.

In order to form the first and second trenches, a pad oxide pattern and a polish stop pattern are sequentially stacked on the semiconductor substrate. Then, the semiconductor substrate is etched using the polish stop pattern as an etch mask. Preferably, the second trench is formed to be wider than the first trench. After forming the first and second trenches, a nitride liner may be further formed on an entire surface of the semiconductor substrate including the first and second trenches.

The lower isolation pattern may be formed by two methods. In a first method of forming the lower isolation pattern, a lower isolation layer is formed on an entire surface of the semiconductor substrate where the first and second trenches are formed, and then, a photoresist pattern is formed on the first region of the semiconductor substrate having the lower isolation layer formed thereon, leaving the second region exposed. The lower isolation layer in the second region is etched, using the photoresist pattern as an etch mask, to expose at least an upper sidewall of the second trench. After removing the photoresist pattern, the remaining lower isolation layer is etched to expose an upper sidewall of the first trench and simultaneously to form a lower isolation pattern for filling a lower region of the first trench.

In another method of forming the lower isolation pattern, a lower isolation layer is formed on an entire surface of the semiconductor substrate where the first and second trenches are formed, and then, the lower isolation layer is etched to form a lower isolation pattern in the lower region of the first trench. A photoresist pattern is formed on the first region of the semiconductor substrate having the lower isolation pattern formed thereon, leaving the second region exposed. The lower isolation layer remaining in the second region is removed using the photoresist pattern as an etch mask, and then, the photoresist pattern is removed.

In either of these methods, the lower isolation layer is preferably formed from an SOG layer. Additionally, the lower isolation layer is etched preferably by a wet etch, a dry etch or a mixture of both. After forming the lower isolation pattern, a thermal oxidation process (e.g., a curing process) is preferably performed to densify the lower isolation pattern.

In order to form an upper isolation pattern, an upper isolation layer is formed on an entire surface of the semiconductor substrate that results after forming the lower isolation pattern, and then, the upper isolation layer is planarized to expose a top surface of the semiconductor substrate. A chemical mechanical polishing (CMP) process is preferably used to planarize the upper isolation layer. Also, the upper isolation layer is preferably formed of at least one of an HDP oxide or a USG layer.

Another embodiment of the present invention is directed to a structure of trench isolation, in which an SOG pattern is left only in a lower region of a trench that has a high aspect ratio and cannot be easily buried using a conventional method. The structure of trench isolation includes a first trench and a second trench that are formed in a first region and a second region of a semiconductor substrate, respectively; a lower isolation pattern fills a lower region of the first trench while exposing an upper sidewall of the first trench; and an upper isolation pattern fills the second trench and an upper region of the first trench.

Inner walls of the first and second trenches are preferably covered by a nitride liner pattern. Preferably, the lower isolation pattern is formed of an SOG layer, and the upper isolation pattern is formed of at least one of an HDP oxide layer and a USG layer.

DETAILED DESCRIPTION OF THE INVENTION

Korean Patent Application No. 2001-47943, filed on Aug. 9, 2001, and entitled: "Structure of Trench Isolation and Method of Forming the Same," is incorporated by reference herein in its entirety.

The present invention will be described more fully hereinafter with reference to the accompanying drawings, in which preferred embodiments of the present invention are shown. The present invention may, however, be embodied in different forms and should not be construed as limited to the embodiments set forth herein. Rather, these embodiments are provided so that this disclosure will be thorough and complete, and will fully convey the scope of the invention to those of ordinary skill in the art. In the attached figures, the thickness of layers and regions is exaggerated for clarity. Also, when it is mentioned that a layer is "on" another layer or on a substrate, the layer may be directly formed on another layer or on the substrate, or a third layer may be interposed therebetween. Like reference numbers indicate like elements throughout the specification.

Figure 4:
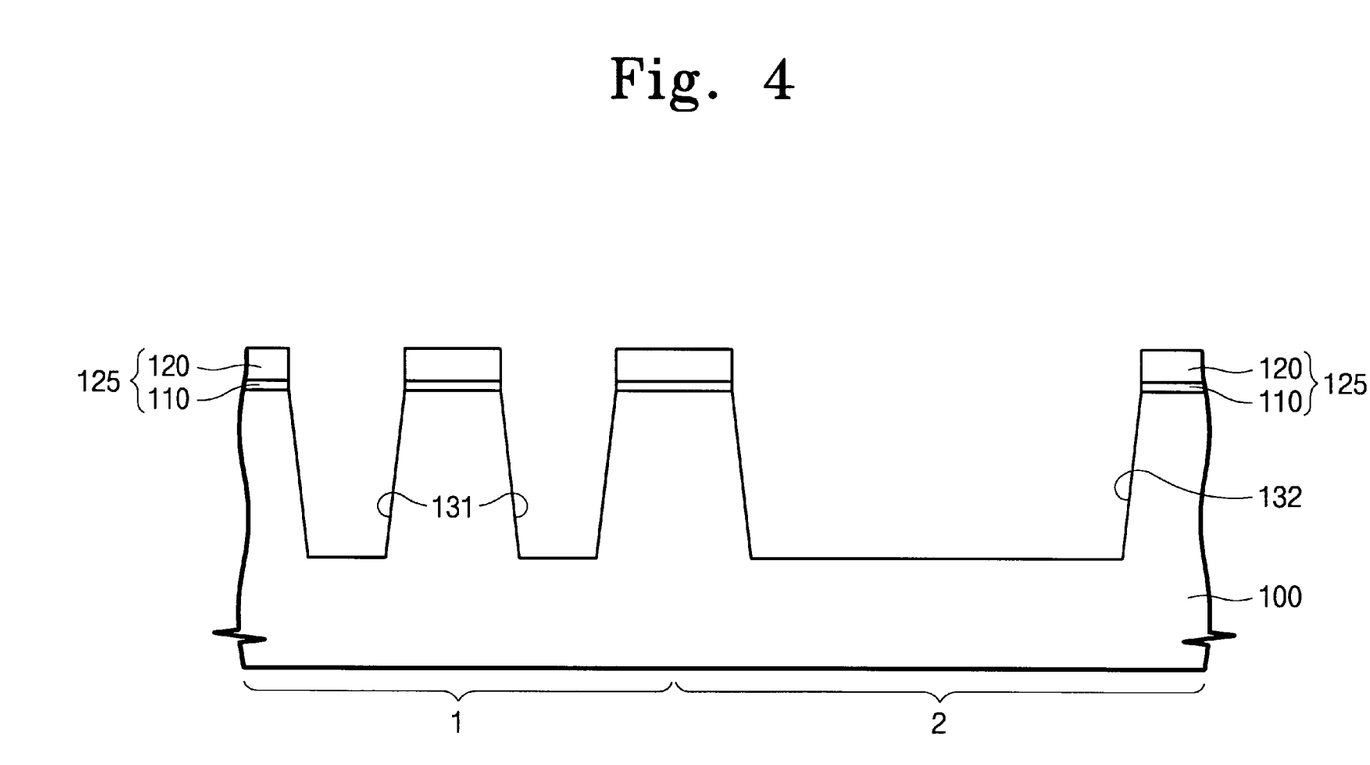
FIGS. 4, 5, 6A, 7A, 8 and 9 illustrate cross-sectional views for explaining a method of forming a structure of trench isolation according to a preferred embodiment of the present invention.

Referring to FIG. 4, a pad oxide layer, a polish stop layer and a hard mask layer are sequentially stacked on a semiconductor substrate 100. The hard mask layer, the polish stop layer and the pad oxide layer are sequentially patterned to form a trench mask pattern 125 composed of a hard mask pattern (not illustrated), a polish stop pattern 120 and a pad oxide pattern 110. The semiconductor substrate 100 is anisotropically etched using the trench mask pattern 125 as an etch mask to simultaneously form a first trench 131 and a second trench 132 at a first region 1 and a second region 2 of the semiconductor substrate, respectively.

The first trench 131 cannot be easily buried using a conventional HDP oxide layer. That is, a gap region, surrounded by the trench mask pattern 125 and an inner wall of the first trench 131, represents a situation where the aspect ratio is at least 4 or more. On the contrary, another gap region, surrounded by the trench mask pattern 125 and the second trench 132, represents a situation where the aspect ratio is 4 or less.

The trench mask pattern 125 may further include a reflection preventing pattern (not illustrated) formed on the hard mask pattern (not illustrated). The reflection preventing pattern, the hard mask pattern and the polish stop pattern 120 are preferably formed of a silicon oxynitride, a silicon oxide, and a silicon nitride, respectively. For stabilization of a subsequent planarization process, the reflection preventing pattern and the hard mask pattern are preferably removed in the etching process for forming the first and second trenches 131 and 132.

Figure 5:
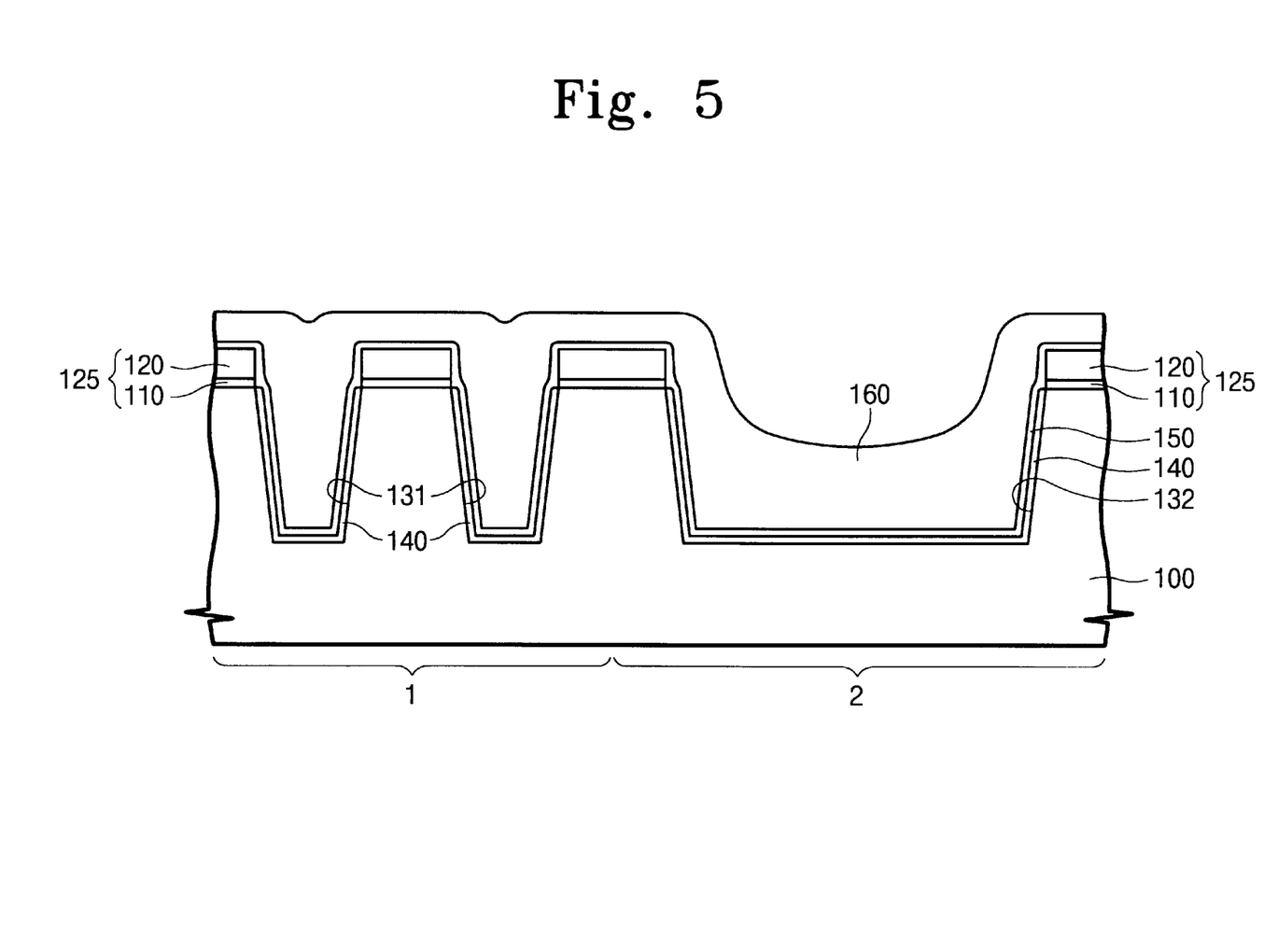

Referring to FIG. 5, a thermal oxide layer 140 is formed on inner walls of the first and second trenches 131 and 132 by a selective thermal oxidation process. A nitride liner 150 and a lower isolation layer 160 are sequentially stacked on the entire surface of the semiconductor substrate including the thermal oxide layer 140.

The lower isolation layer 160 is preferably formed from an SOG layer having a superior filling characteristic. In a method of forming the lower isolation layer 160, an SOG layer in a liquid state is coated on the semiconductor substrate where the nitride liner 150 is formed, and then, the semiconductor substrate is rotated. Then, the SOG layer-coated semiconductor substrate is thermally treated to remove a solvent contained in the SOG layer. Thus, the lower isolation layer 160 has a planarized top surface in the first region 1, including the first trench 131 having the narrow gap. As explained in the Description of the Related Art section, however, the lower isolation layer 160 has a top surface that is not flat in the second region, including the second trench 132 having the wide gap. That is, the lower isolation layer 160 of the second region is thicker at an edge of the second trench 132 than at a center of the second trench 132.

The thermal oxide layer 140 is preferably formed of a material layer for curing damage resulting from an etch process for forming the first and second trenches 131 and 132 in the semiconductor substrate 100. The thermal oxide layer 140 is preferably formed to a thickness of 110 Å. The nitride liner 150 acts as an etch stop layer to prevent damage to the thermal oxide layer 140 and the semiconductor substrate 100 in a subsequent process of etching the lower isolation layer 160. Thus, the nitride liner 150 is formed of a material having an etch selectivity with respect to the lower isolation layer 160, preferably, a silicon nitride. Further, the nitride liner 150 is formed of a material for preventing diffusion of impurities into the semiconductor substrate, such as oxygen atoms that are implanted in a subsequent process or impurities contained in the lower isolation layer 160. Thus, the nitride liner 150 is preferably formed of a low-pressure chemical vapor deposition (LPCVD) silicon nitride layer having a superior characteristic for preventing diffusion of impurities. In order to prevent the diffusion of the impurities sufficiently, and to simultaneously minimize the effect of the nitride liner 150 with respect to the aspect ratio of the first trench 131, the nitride liner 150 is preferably conformally formed to a thickness of from about 30 to 140 Å.

Figure 6A:
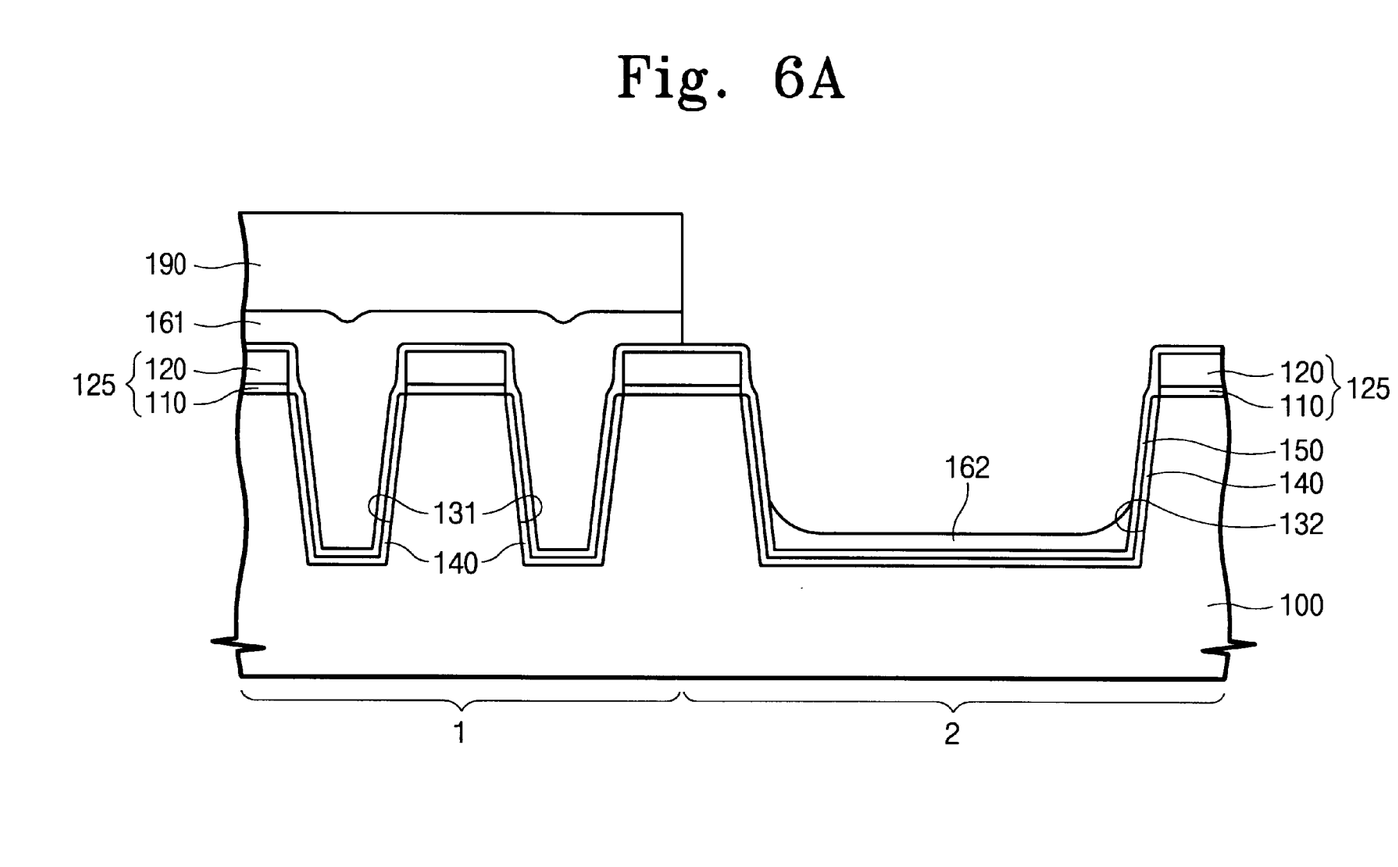

Referring to FIG. 6A, a photoresist pattern 190 is formed to cover the lower isolation layer (160 of FIG. 5) of the first region 1, but to expose the lower isolation layer 160 of the second region 2. As the lower isolation layer 160 of the second region 2 is etched using the photoresist pattern 190 as an etch mask, a first lower isolation layer 161 and a second lower isolation layer 162 are formed. Then, the photoresist pattern 190 is removed.

The second lower isolation layer 162 is a remaining portion of the lower isolation layer 160 in the second region 2, which is obtained by performing a selective etching process using the photoresist pattern 190 with respect to the lower isolation layer 160 in the second trench 132. The second lower isolation layer 162 preferably has a top surface that is lower than that of the semiconductor substrate 100. Further, the second lower isolation layer 162 may be removed during the etching process. The first lower isolation layer 161 is a remaining portion of the lower isolation layer 160 in the first region 1, which is not etched by the selective etching process using the photoresist pattern 190 with respect to the lower isolation layer 160 in the first trench 131. Thus, the first lower isolation layer 161 still covers the first trench 131 and a top surface of the trench mask pattern 125 of the first region 1.

The first and second lower isolation layers 161 and 162 are preferably formed using an etch recipe having an etch selectivity with respect to a nitride layer, to minimize etch damage with respect to the nitride liner 150. Additionally, the etching process may be a wet etch, a dry etch or a mixture of both, and is preferably a wet etch including a fluoric acid as an etchant.

Figure 7A:
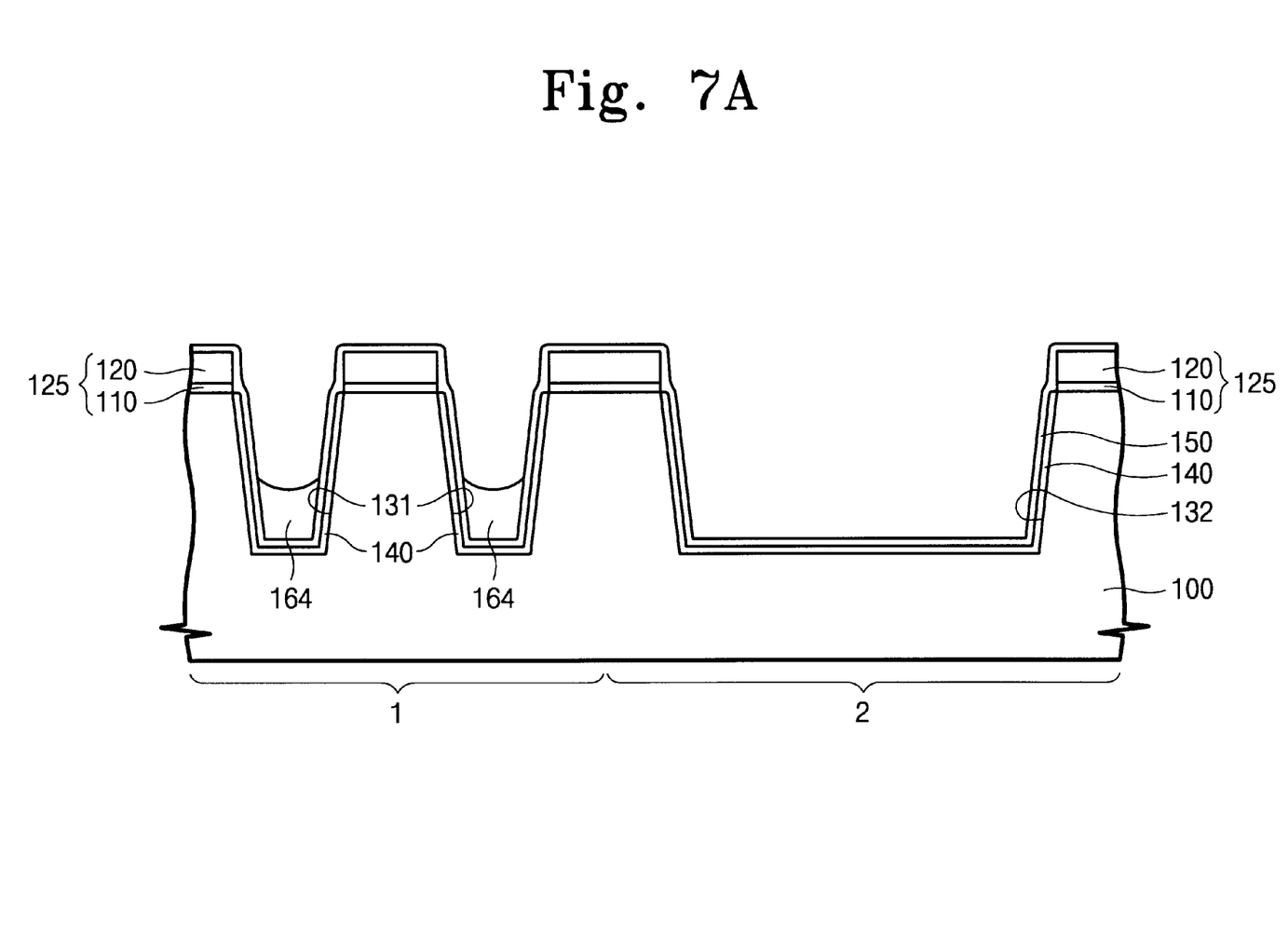

Referring to FIG. 7A, the first lower isolation layer 161 is etched to form a lower isolation pattern 164 to fill a lower region of the first trench 131. The etching process for forming the lower isolation pattern 164 includes an etch recipe having an etch selectivity with respect to a nitride layer. The etching process may be a wet etch, a dry etch, or a mixture of both, and is preferably a wet etch including a fluoric acid as an etchant. Thus, even if the second lower isolation layer 162 remains in the second trench 132, the second lower isolation layer 162 is removed in an etching process for forming the lower isolation pattern 164.

As explained with regard to the conventional technology, a difference in density of an SOG layer according to an aspect ratio of a trench results in a problem in that a groove is formed in the second trench 132. In the present invention, the second lower isolation layer 162 is removed as previously described to solve this problem. However, even if the second lower isolation layer 162 remains, if the second lower isolation layer 162 has a top surface that is sufficiently lower than that of the semiconductor substrate 100, formation of the groove of the conventional technology may be prevented. Thus, it is possible to not remove the second lower isolation layer 162, provided that a top surface thereof is formed lower than that of the semiconductor substrate 100.

Similarly, a top surface of the lower isolation pattern 164 is preferably lower than that of the semiconductor substrate 100, by, for example, at least 500 Å, to prevent a problem such as the groove. The lower isolation pattern 164 is a material formed for reducing an aspect ratio of the first trench 131. Thus, because of the lower isolation pattern 164, the aspect ratio of first trench 131 should permit filling of the first trench 131 with a subsequent upper isolation layer. That is, there are an upper limit and a lower limit in the height of the top surface of the lower isolation pattern 164. Because of the above limits on the lower isolation pattern 164, the lower isolation pattern 164 differs from the second isolation layer 162, which is allowed to be completely removed. The following explanations are limited to the case wherein the second isolation layer 162 is completely removed during the etching process for forming the lower isolation pattern 164.

Figure 8:
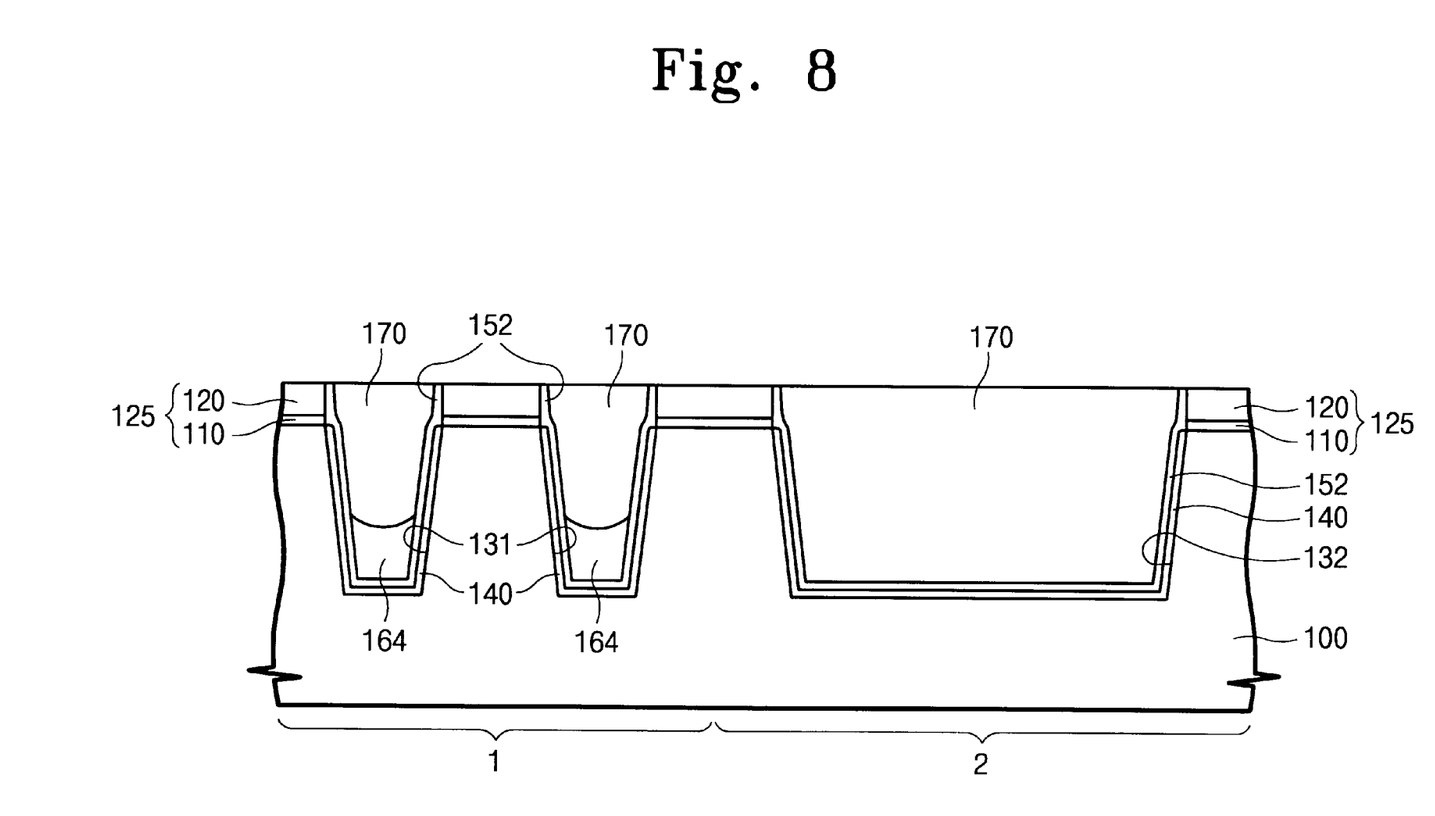

Referring to FIG. 8, when the lower isolation pattern 164 is formed from an SOG layer, a curing process is performed with respect to the semiconductor substrate including the lower isolation pattern 164. During the curing process, oxygen atoms are penetrated into the lower isolation pattern 164, so that the SOG layer has characteristics of an oxide layer. The curing process is preferably performed using an oxygen gas or deionized water.

An upper isolation layer is formed on the entire surface of the cured semiconductor substrate, to fill the second trench 132 and the upper region of the first trench 131 where the lower isolation pattern 164 is formed. The upper isolation layer is preferably formed of an HDP oxide layer or a USG layer using a conventional method. Because the aspect ratio of the first trench 131 has been reduced by the lower isolation pattern 164, the first trench 131 may be filled with the HDP oxide layer or the USG layer without a void being formed therein. If an HDP oxide layer is used for the upper isolation layer, the surface of the nitride liner 150 may be damaged by the plasma. In order to prevent this, before forming the HDP oxide layer, another LPCVD oxide layer having a thickness of about 100 Å may be formed on the semiconductor substrate, including the nitride liner 150.

As the upper isolation layer and the nitride liner 150 are sequentially planarization-etched until the polish stop pattern 120 is entirely exposed, an upper isolation pattern 170 and a nitride liner pattern 152 are formed. The planarization-etching process is preferably a chemical mechanical polishing (CMP) technique. Also, when a height of the upper isolation pattern 170 differs significantly from that of the semiconductor substrate 100, it is preferable to decrease the height difference in order to prevent any difficulty in a subsequent step. The polish stop pattern 120 is used as an etch stopping layer in the etching process for forming the upper isolation pattern 170.

Figure 9:
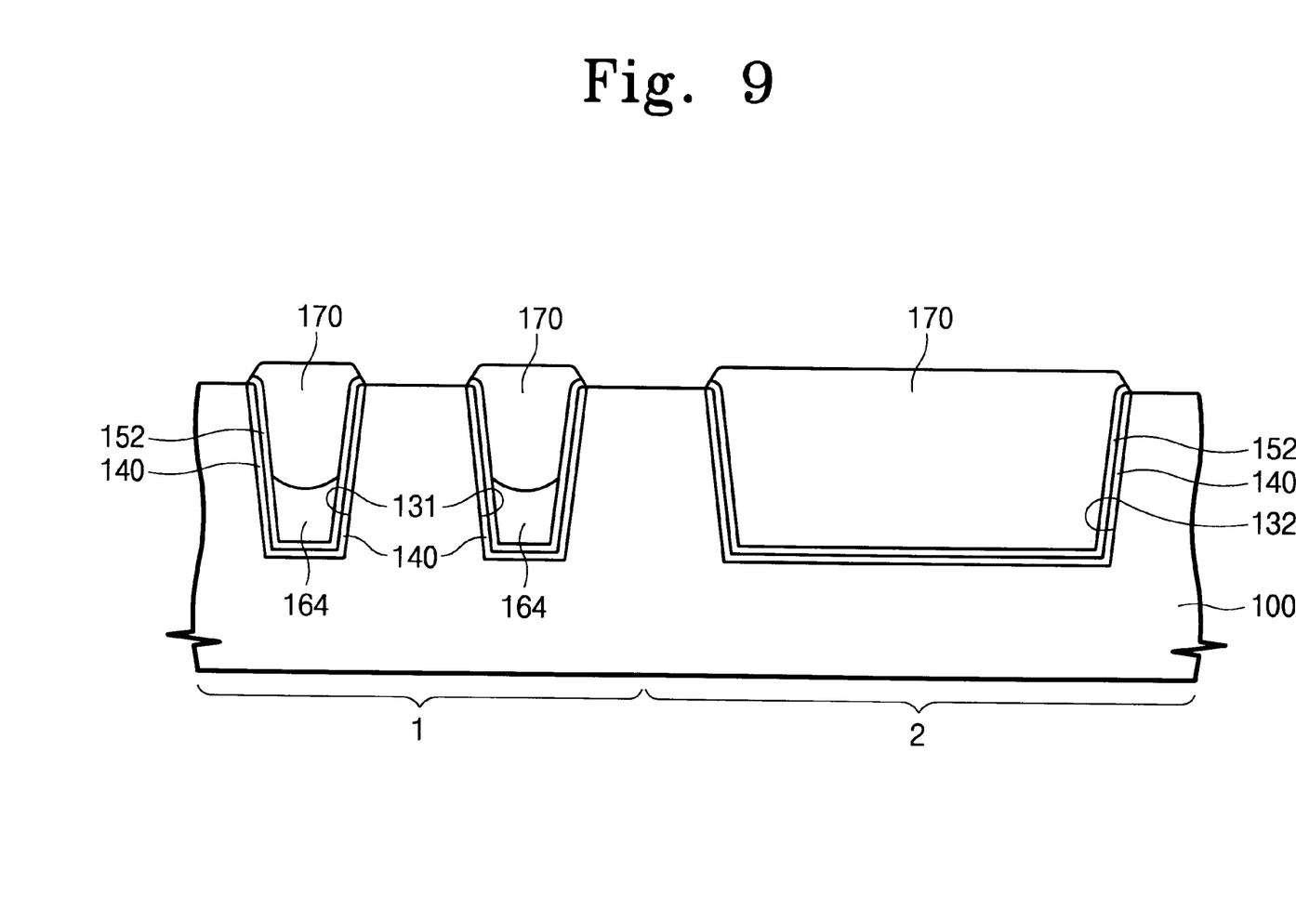

Referring to FIG. 9, the polish stop pattern (120 of FIG. 8) and the pad oxide pattern (110 of FIG. 8) are sequentially removed to expose the top surface of the semiconductor substrate 100.

The etching process for removing the polish stop pattern 120 is preferably an isotropic etching method using a silicon nitride etch recipe having an etch selectivity with respect to a silicon oxide layer. If the polish stop pattern 120 is not completely removed, a subsequent process for removing a pad oxide pattern 110 under the polish stop pattern 120 is imperfectly performed. Therefore, the process of removing the polish stop pattern 120 is performed by an over etch to ensure complete exposure of the top surface of the pad oxide pattern 110.

The pad oxide pattern 110 having an exposed top surface is removed by an isotropic etching method using a silicon oxide etching recipe having an etch selectivity with respect to a silicon. Despite the etching recipe, however, the upper isolation pattern 170 has a recessed and rounded top edge.

Contrary to the conventional technology described in the Description of the Related Art section, the first and second trenches 131 and 132 are covered by the upper isolation pattern 170, so that the lower isolation pattern 164 composed of the SOG layer is not exposed. Thus, generation of a groove due to a fast etching rate of the SOG layer is prevented.

Removal of the lower isolation layer 160 in the second trench 132 may be realized by another embodiment of the present invention in which the processes illustrated in FIGS. 6A and 7A are changed, but in which the processes illustrated in FIGS. 4, 5, 8, and 9, remain the same as in the previously described embodiment.

Figure 6B:
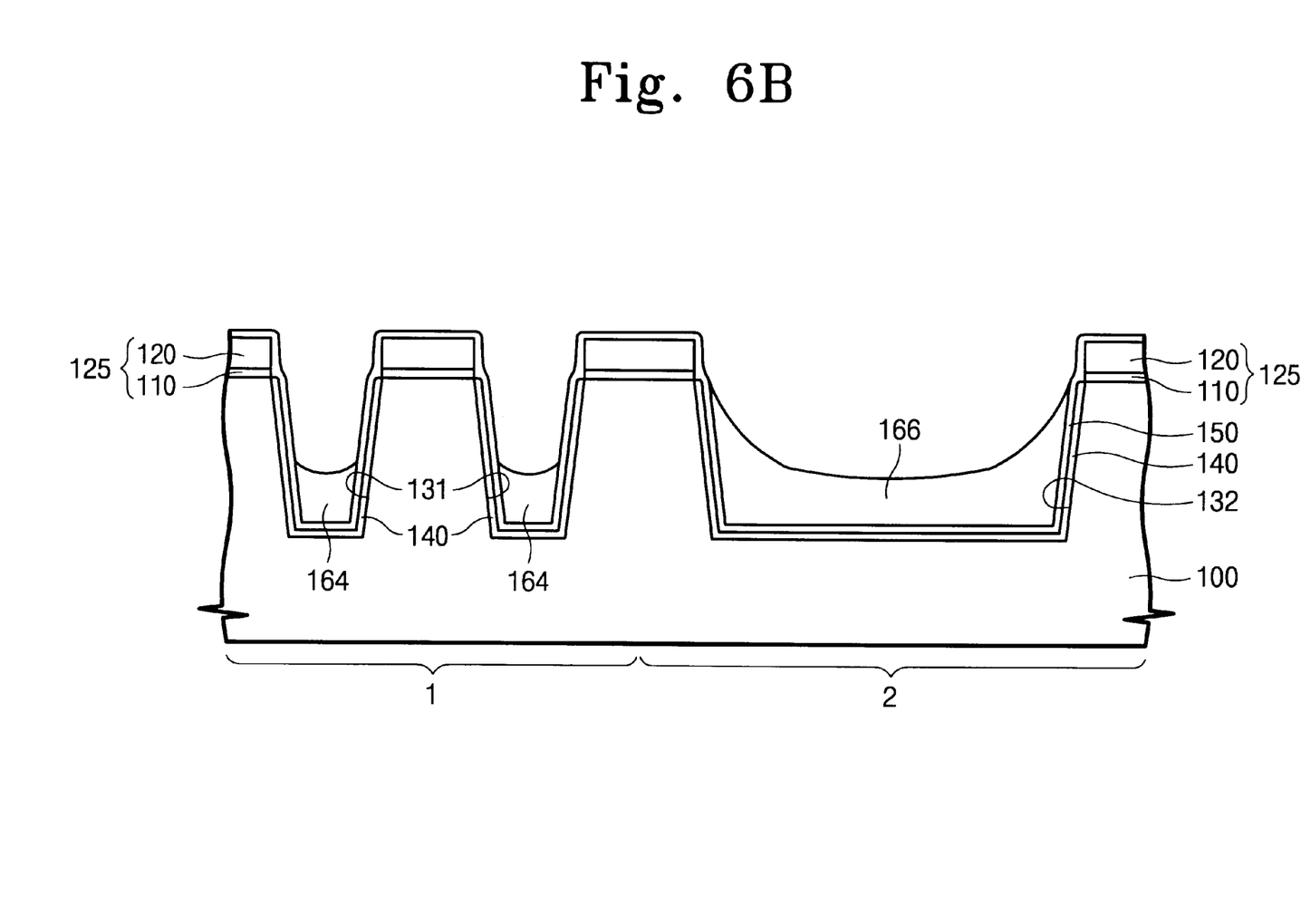
FIGS. 6B and 7B illustrate cross-sectional views for explaining a method of forming a structure of trench isolation according to another preferred embodiment of the present invention.
Figure 7B:
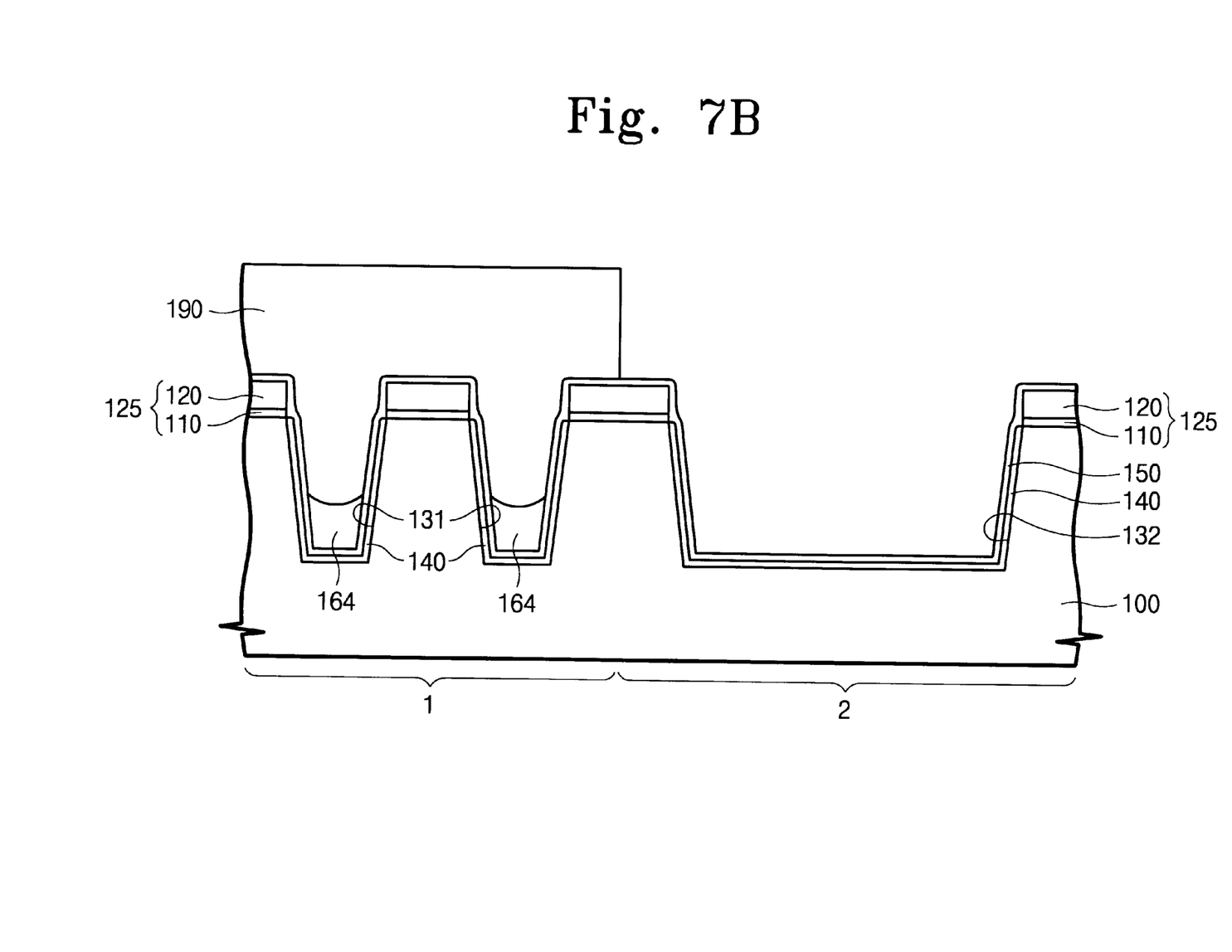

FIGS. 6B and 7B illustrate cross-sectional views for explaining a method of forming a structure of trench isolation according to another preferred embodiment of the present invention.

Referring to FIG. 6B, the lower isolation layer 160 explained in FIG. 5 is entirely etched to form a lower isolation pattern 164 filling a lower region of the first trench 131 and a third lower isolation layer 166 filling a lower region of the second trench 132.

As described in the process of FIG. 7A, the height of the top surface of lower isolation pattern 164 is preferably lower than the height of the top surface of semiconductor substrate 100, by at least 500 Å, thereby decreasing the aspect ratio of the first trench 131. The first trench 131 is preferably formed to have an aspect ratio of 4 or less by being filled with the lower isolation pattern 164. Because of a difference in densities due to the aspect ratio of a trench as previously explained, the third isolation layer 166 has a top surface that is higher than that of the lower isolation pattern 164 after a process of etching the lower isolation layer 160.

Referring to FIG. 7B, a photoresist pattern 190 is formed to cover the first region 1, and then, the third lower isolation layer 166 in the second trench 132 is removed using the photoresist pattern 190 as an etch mask. Then, the photoresist pattern 190 is removed.

Thus, the lower isolation pattern 164 fills a lower region of the first trench 131 but the third lower isolation layer 166 is removed from the second trench 132.

Figure 10:
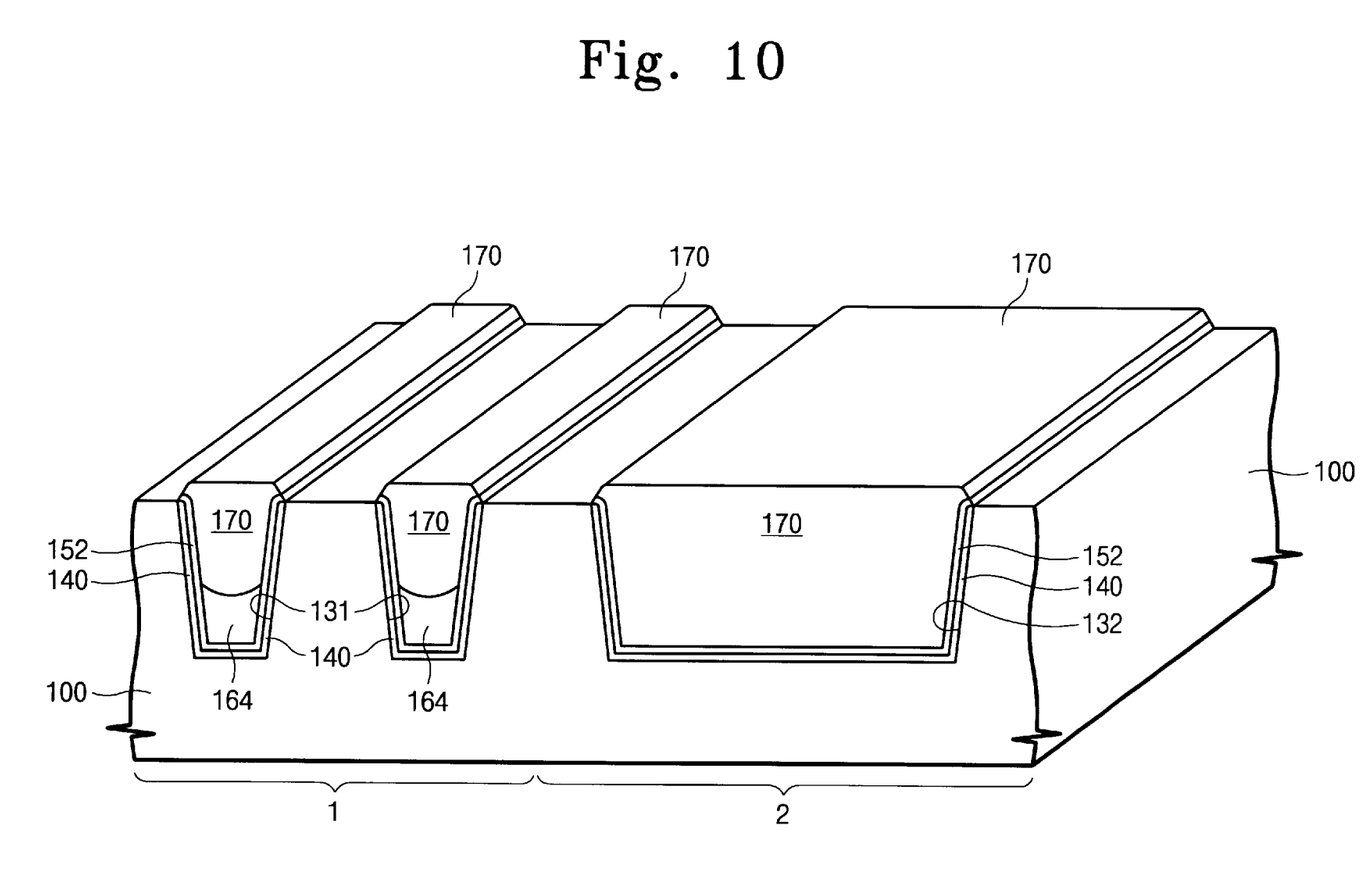
FIGS. 10 and 11 illustrate perspective views for explaining a structure of trench isolation according to still another preferred embodiment of the present invention.

Referring to FIG. 10, a first trench 131 and a second trench 132 are formed to define an active region at a first region 1 and a second region 2 of a semiconductor substrate 100, respectively. The first and second regions 1 and 2 are distinguished by an aspect ratio of a trench formed in each region. Preferably, a trench having an aspect ratio of 4 or more is formed in the first region 1, and another trench having an aspect ratio of 4 or less is formed in the second region 2.

A thermal oxide layer 140 and a nitride liner pattern 152 are sequentially stacked on inner walls of the first and second trenches 131 and 132. Preferably, the thermal oxide layer 140 and the nitride liner pattern 152 are conformally formed. Preferably, the thickness of the thermal oxide layer 140 is about 110 Å, and that of the nitride liner pattern 152 is from about 30 to 140 Å.

Figure 11:
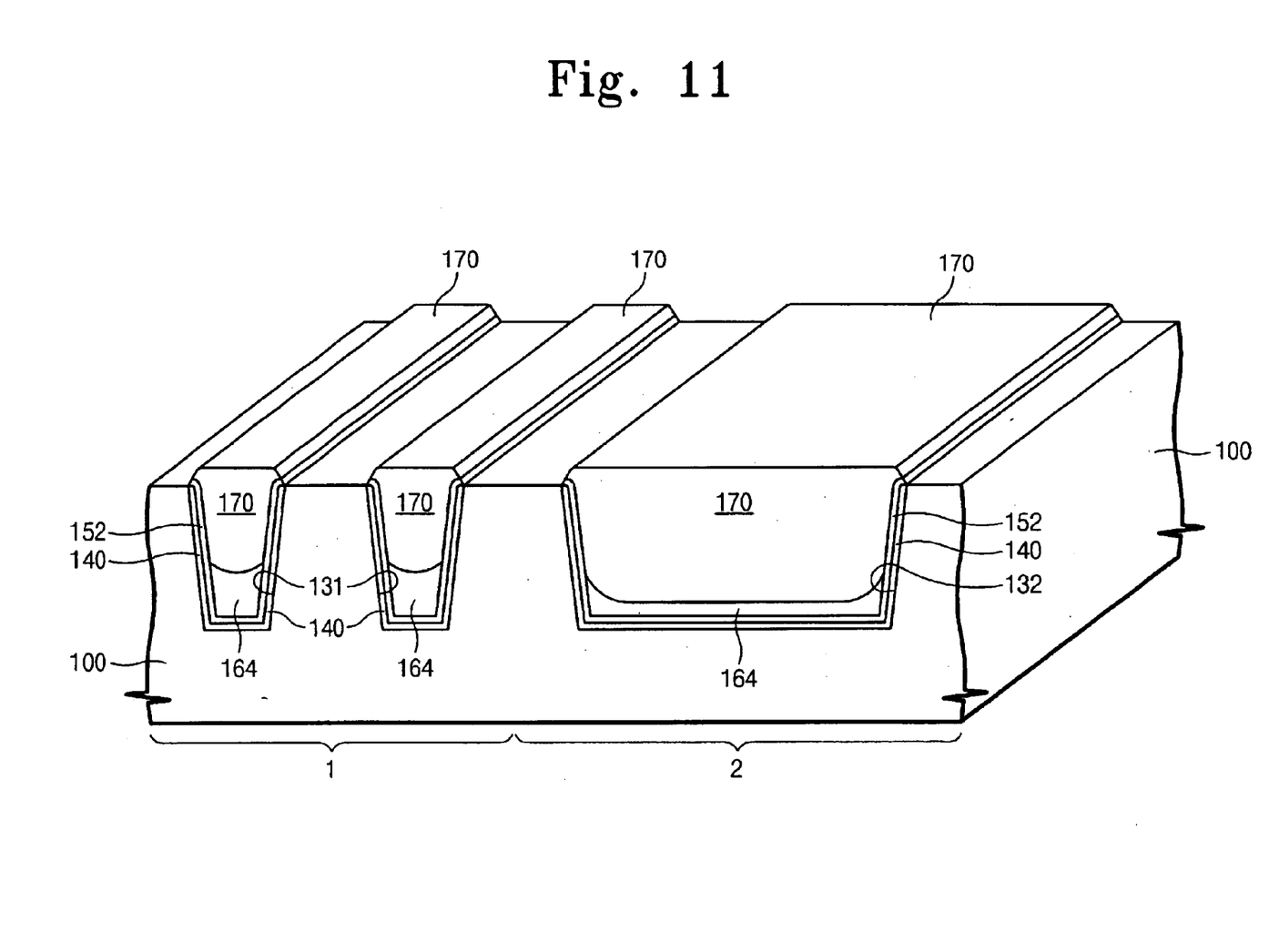

A lower isolation pattern 164 having a top surface that is lower than that of the semiconductor substrate 100 is formed in a lower region of the first trench 131 where the nitride liner pattern 152 is formed. The top surface of the lower isolation pattern 164 is preferably lower than that of the semiconductor substrate 100 by at least 500 Å. Further, a gap region, which is surrounded by a sidewall of the first trench 131 where the thermal oxide layer 140 and the nitride liner pattern 152 are formed, and by the top surface of the lower isolation pattern 164, preferably has an aspect ratio of 3 or less. The lower isolation pattern 164 may remain even in the lower region of the second trench 132, as shown in FIG. 11, and in this case, should have a top surface lower than that of the semiconductor substrate 100 by at least 500 Å, similar to the lower isolation pattern 164 formed in the first trench 131. However, the lower isolation pattern 164 is necessary in the first trench 131, but not essential in the second trench 132.

An upper isolation pattern 170 is formed in an upper region of the first trench 131 where the lower isolation pattern 164 is formed. Additionally, the upper isolation pattern 170 is formed to fill the second trench 132. Thus, the first trench 131 is filled with the sequentially stacked lower isolation pattern 164 and upper isolation pattern 170, and the second trench 132 is filled with the upper isolation pattern 170.

A top surface of the upper isolation pattern 170 is higher than that of the semiconductor substrate 100, but the difference in height thereof is preferably small, e.g., 100 Å or less. Additionally, the top surface of the upper isolation pattern 170 is preferably recessed. Preferably, the lower isolation pattern 164 is formed from an SOG layer and the upper isolation pattern 170 is formed of one of an HDP oxide layer and a USG layer.

According to the present invention, a trench having a wide gap is filled with an upper isolation pattern only, but another trench having a narrow gap is filled with a sequentially stacked lower isolation pattern and upper isolation pattern. Having two isolation patterns in a trench having a narrow gap reduces the aspect ratio thereof, thereby allowing the trench to be filled without formation of a void in the filling layer. The present invention may further prevent formation of a groove in which the lower isolation pattern is exposed, and a resulting bridge between gate patterns in a finished device.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A structure of trench isolation, comprising:
   a first trench and a second trench that are formed in a first region and a second region of a semiconductor substrate, respectively, the first trench having a higher aspect ratio than the second trench;
   a lower isolation pattern filling a lower region of the first trench while exposing an upper sidewall of the first trench; and
   an upper isolation pattern filling the second trench and an upper region of the first trench,
   wherein the lower isolation pattern and the upper isolation pattern are formed of different materials.

2. The structure as claimed in claim 1, further comprising a nitride liner pattern to cover inner walls of the first and second trenches.

3. The structure as claimed in claim 2, wherein the nitride liner is silicon nitride.

4. The structure as claimed in claim 3, wherein the nitride liner is formed by low pressure chemical vapor deposition (LPCVD).

5. The structure as claimed in claim 3, wherein the nitride liner is formed to a thickness of about 30 to 140 Å.

6. The structure as claimed in claim 1, wherein the lower isolation pattern is formed of an SOG layer.

7. The structure as claimed in claim 1, wherein the upper isolation pattern is formed of at least one of an HDP oxide layer and a USG layer.

8. The structure as claimed in claim 7, wherein when the upper isolation pattern is formed of an HDP oxide layer, an LPCVD oxide layer is formed on the substrate including the nitride liner before forming the HDP oxide layer.

9. The structure as claimed in claim 8, wherein the LPCVD oxide layer is formed to a thickness of about 100 Å.

10. A structure of trench isolation, comprising:
    a first trench and a second trench that are formed in a first region and a second region of a semiconductor substrate, respectively, the first trench having a higher aspect ratio than the second trench;
    a lower isolation pattern filling lower regions of the first and second trenches, wherein an uppermost surface of the lower isolation pattern is lower than tops of the first and second trenches; and
    an upper isolation pattern filling upper regions of the first and second trenches,
    wherein the lower isolation pattern and the upper isolation pattern are formed of different materials.

11. The structure as claimed in claim 10, further comprising a nitride liner pattern to cover inner walls of the first and second trenches.

12. The structure as claimed in claim 10, wherein the lower isolation pattern is formed of an SOG layer.

13. The structure as claimed in claim 10, wherein the upper isolation pattern is formed of at least one of an HDP oxide layer and a USG layer.

* * * * *